United States Patent
Petricek et al.

(10) Patent No.: US 7,061,765 B2
(45) Date of Patent: Jun. 13, 2006

(54) ELECTRONIC DEVICE

(75) Inventors: Martin Petricek, Hollabrunn (AT); Thomas Rothmayer, A-Wien (AT)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/508,634

(22) PCT Filed: Mar. 24, 2003

(86) PCT No.: PCT/AT03/00081

§ 371 (c)(1),
(2), (4) Date: Sep. 17, 2004

(87) PCT Pub. No.: WO03/081970

PCT Pub. Date: Oct. 2, 2003

(65) Prior Publication Data

US 2005/0128712 A1 Jun. 16, 2005

(30) Foreign Application Priority Data

Mar. 25, 2002 (AT) ................................ A 464/2002

(51) Int. Cl.
*H05K 7/20* (2006.01)
(52) U.S. Cl. ....................... 361/719; 361/720; 361/721; 174/252; 165/80.3; 165/185
(58) Field of Classification Search ........ 361/687–690, 361/695–699, 704, 718–721; 257/718, 719; 174/16.1, 16.3, 252; 165/80.3, 104.33, 185
See application file for complete search history.

(56) References Cited

U.S. PATENT DOCUMENTS

| | | | | |
|---|---|---|---|---|
| 4,621,304 A | | 11/1986 | Oogaki et al. | |
| 5,467,251 A | * | 11/1995 | Katchmar | 361/719 |
| 5,708,566 A | * | 1/1998 | Hunninghaus et al. | 361/704 |
| 5,726,858 A | * | 3/1998 | Smith et al. | 361/705 |
| 5,973,923 A | * | 10/1999 | Jitaru | 361/704 |
| 5,991,155 A | | 11/1999 | Kobayashi et al. | |
| 6,025,991 A | * | 2/2000 | Saito | 361/704 |
| 6,034,874 A | * | 3/2000 | Watanabe | 361/704 |
| 6,058,013 A | * | 5/2000 | Christopher et al. | 361/704 |
| 6,101,095 A | * | 8/2000 | Yamaguchi | 361/720 |
| 6,257,328 B1 | * | 7/2001 | Fujiwara et al. | 165/185 |
| 6,822,856 B1 | * | 11/2004 | Fujiwara | 361/681 |
| 6,914,780 B1 | * | 7/2005 | Shanker et al. | 361/687 |

FOREIGN PATENT DOCUMENTS

WO    WO 01/84898 A2    11/2001

* cited by examiner

*Primary Examiner*—Boris Chérvinsky

(57) ABSTRACT

An electronic device (GER) with a housing (GEH), in which at least one circuit substrate (STT) is provided with an assembly side (BES), whereby at least one electronic component (BAU) is arranged on the assembly side, whereby an essentially plate-like cooling element (KUE) made of metal is arranged on the inside of a side wall (SEI) of the housing (GEH) opposite the assembly side (BES) and running essentially parallel to the circuit substrate (STT), said cooling element being connected thermally in the assembled state to the at least one component (BAU) arranged on the assembly side (BES).

10 Claims, 1 Drawing Sheet

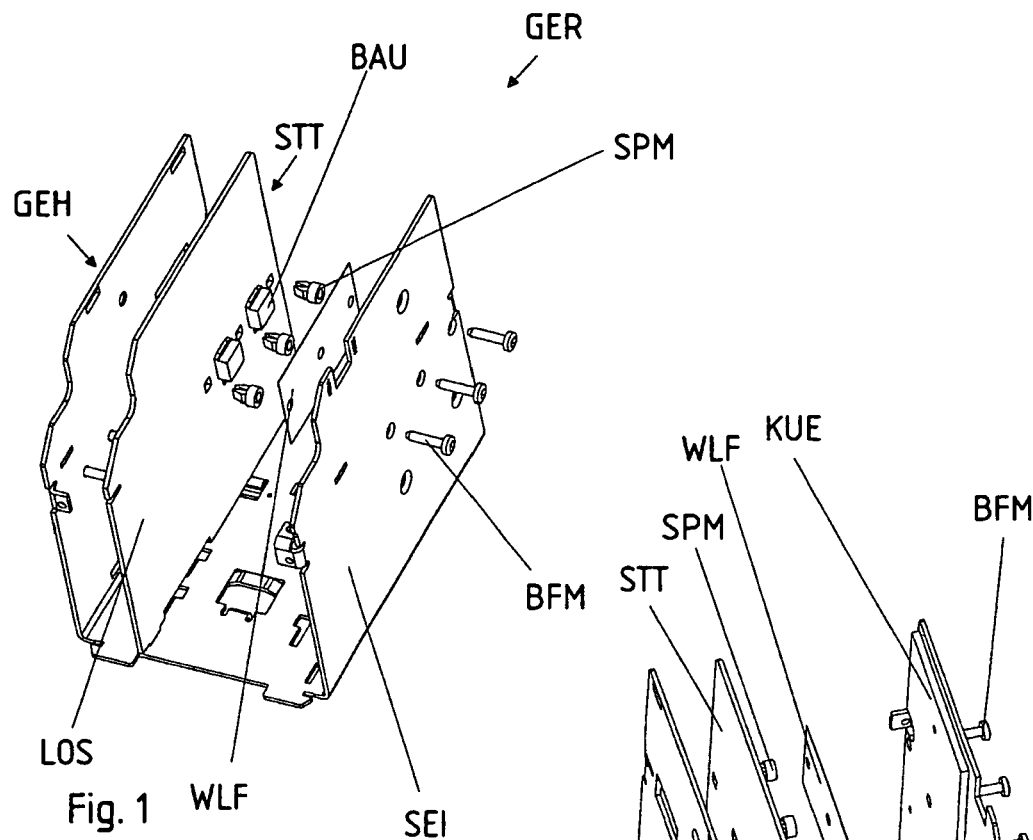
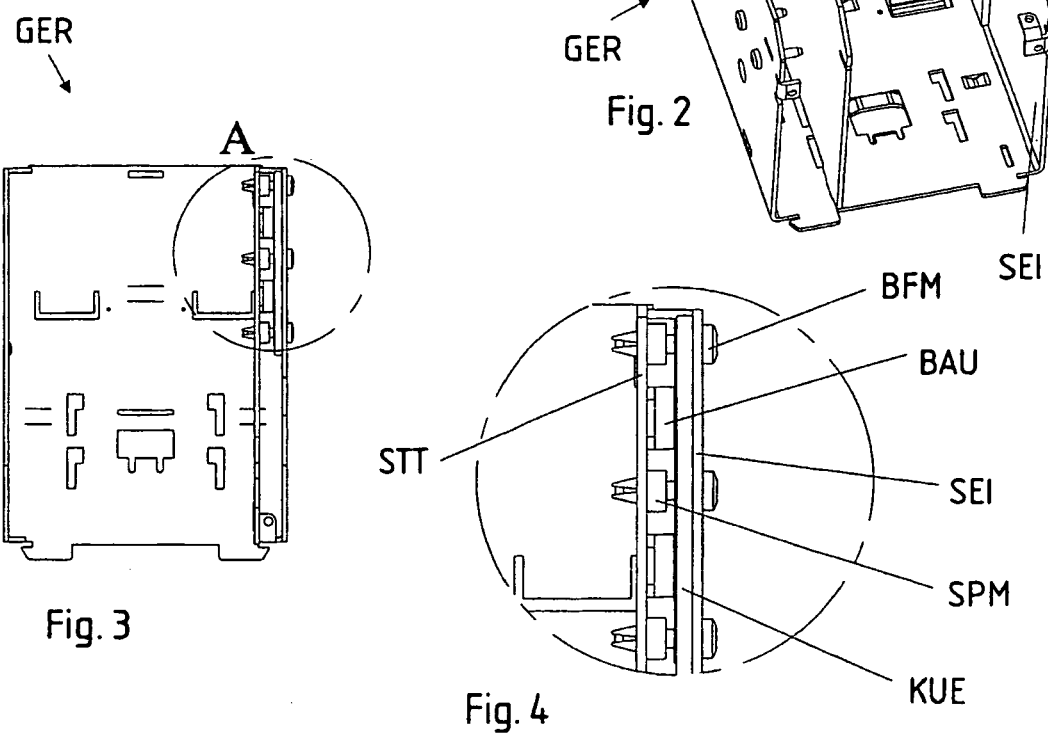

ELECTRONIC DEVICE

CROSS REFERENCE TO RELATED APPLICATIONS

This application is the US National Stage of International Application No. PCT/AT03/00081 filed Mar. 24, 2003 and claims the benefit thereof. The International Application claims the benefit of Austrian application No. A 464/2002 filed Mar. 25, 2002, both of the applications are incorporated by reference herein in their entirety.

FIELD OF INVENTION

The invention relates to an electronic device with a housing, in which at least one circuit substrate (e.g. a circuit carrier or a circuit board) is provided, whereby at least one electronic component is arranged on the circuit substrate, an essentially plate-like cooling element made of metal is arranged on the inside of a side wall of the housing opposite the side of the circuit substrate, on which the at least one component is arranged, running essentially parallel to the circuit substrate, said cooling element being connected thermally in the assembled state to the at least one component arranged on the assembly side.

BACKGROUND OF INVENTION

The cooling of components, in particular semiconductor components, which are arranged on circuit substrates (e.g. circuit carriers or circuit boards), is of significant importance with regard to the correct operation of an electronic device.

One known option for protecting semiconductor components against overheating is to distribute the resulting power loss to a plurality of semiconductors. In another frequently used method, cooling elements are mounted on the circuit substrate but these take up a lot of space on the circuit substrate. Also the last-mentioned method requires additional attachment elements to press the semiconductor components against the cooling elements, thereby making thermal contact.

Such a cooling element is for example known from U.S. Pat. No. 5,991,155 A. This document discloses a cooling element for an electronic device, which has a U-shaped cross-section, whereby a chamber is formed by the cooling element and a side wall of the housing, which is filled with a heat-transfer compound.

U.S. Pat. No. 4,621,304 A discloses a plate-like cooling element of the type mentioned above, which is screwed to a side wall of an electronic device with screws, whereby a component to be cooled is in contact with the screws and is therefore at a distance from the cooling element.

A disadvantage of the known solutions is that they are associated with a large space requirement on the circuit substrate and assembly and material costs are very high, which could also result in high production costs. The last-mentioned solution also has the disadvantage that the structure is such that optimum heat transfer is not achieved between the plate-like cooling element and the component to be cooled.

SUMMARY OF INVENTION

One object of the invention is therefore to create an electronic device, with which the above-mentioned disadvantages of the known devices can be overcome.

This object is achieved according to the invention with an electronic device of the type mentioned above, in that when the device is in the assembled state the side wall is fixed to the circuit substrate by means of attachment devices, thereby pressing the cooling element against the back of the component to be cooled.

The thermal connection with a cooling element arranged on a wall of the housing means that the heat can be transferred away from components and dissipated via the housing to the environment, whereby the cooling element can be configured as a metal sheet. The inventive solution means that electronic devices can be produced significantly more easily and at lower cost.

To improve the transfer of heat between a component and the cooling element, a heat-conducting film can be provided between the at least one component and the cooling element.

The cooling element is advantageously attached, for example riveted, to the side wall.

Favorable cooling characteristics are achieved, if the cooling element is made of copper or a copper alloy or aluminum or an aluminum alloy.

Optimum cooling and very simple assembly of the device can be ensured by fixing the side wall to the circuit substrate by means of attachment devices when the device is in the assembled state and pressing the cooling element against the back of the at least one component.

BRIEF DESCRIPTION OF THE DRAWINGS

The invention and further advantages are described in more detail below with reference to a non-restrictive embodiment shown in the drawing, in which:

FIG. 1 shows a perspective view of an inventive electronic device during assembly;

FIG. 2 shows a different perspective view of the device in FIG. 1 during assembly;

FIG. 3 shows a top view of the device in FIG. 1 in the assembled state and

FIG. 4 shows the area A in FIG. 3 in more detail.

DETAILED DESCRIPTION OF INVENTION

According to FIGS. 1 and 2 an inventive electronic device GER comprises a housing GEH, in which a circuit substrate STT is arranged with a solder side LOS. At least one electronic component BAU is arranged on the surface of the solder side LOS of the circuit substrate, whereby the component BAU runs through the tin-lead solder in an automatic soldering process. In the case of the surface assembly shown here the assembly side and solder side LOS are identical. The components BAU required for this, known as surface mounted devices or SMD components, generally have no terminal wires. Their terminal faces are soldered directly to a printed conductor on the circuit substrate STT. Holes in the circuit substrate STT are only required for through-contacts and in the case of a chip mix as well as for fitting attachment elements.

Although the embodiment of the invention shown here relates to SMD components, the invention is in no way restricted to the use of SMD components BAU. The inventive solution can also be used for components BAU, which are arranged on a circuit substrate STT with an assembly side and a solder side, which are opposite each other.

According to the invention an essentially plate-like cooling element KUE made of metal, for example aluminum or a copper alloy, is arranged on the inside of a side wall SEI of the housing GEH, opposite the side of the circuit substrate STT, on which the components BAU are arranged, running essentially parallel to the circuit substrate STT. In the assembled state the cooling element KUE is connected thermally to the components BAU arranged on the solder side LOS.

The cooling element KUE is preferably made from a piece of metal sheet and attached to the side wall SEI, for example the cooling element KUE and the side wall SEI are riveted together. When the device GER is in the assembled state, the side wall SEI is fixed to the circuit substrate STT by means of attachment devices BFM, whereby the cooling element KUE is pressed against the backs of the components BAU, so that a good thermal connection is ensured between the components BAU and the cooling element KUE.

As the cooling element KUE is in thermal contact with the side wall SEI, the thermal energy transferred from the components BAU to the cooling element KUE can be dissipated to the environment via the side wall SEI. The intrinsic convection of the cooling element KUE and the side wall SEI means that a good cooling capacity is achieved and there is no need for additional cooling devices in the housing GEH, such as fans etc.

Plastic expansion nuts SPM can be pressed into the circuit substrate STT to connect the side wall SEI to the circuit substrate STT, whereby the attachment devices BMF, e.g. screws, preferably screws with threads for plastic materials, can be inserted into the expansion nuts SPM through holes in the side wall SEI. By screwing these special screws to the expansion nuts SPM in this way, the side wall SEI of the housing GEH can be fixed against the circuit substrate STT and in the assembled state the cooling element KUE can be pressed against the components (FIGS. 3 and 4). In this case the circuit substrate STT takes on the function of a contact yoke for the cooling element KUE.

The transfer of heat from the components BAU to the cooling element KUE can be improved by arranging a heat-conducting film WLF between the components and the cooling element KUE.

The cooling elements KUE arranged on the housing GEH on the one hand allow the number of components BAU required to be optimized to a minimum and on the other hand they eliminate the need to assemble additional cooling elements on the circuit substrate.

The invention claimed is:

1. An electronic device, comprising:
a housing comprising a side wall with an inside surface;
at least one circuit board provided in the housing; and
at least one electronic component arranged on the circuit board, wherein
an essentially plate-like cooling element made of metal separately from the side wall is arranged on the inside surface of the side wall of the housing, opposite a side of the circuit board, on which the at least one component is arranged, running essentially parallel to the circuit board, said cooling element being in contact with the side wall in the assembled state and being connected thermally to the at least one component arranged on an assembly side, wherein
when the device is in the assembled state, the side wall is attached by attachment devices to the circuit board, and wherein
the cooling element is pressed against the back of the component to be cooled.

2. The electronic device according to claim 1, wherein a heat-conducting film is arranged between the at least one component and the cooling element.

3. The electronic device according to claim 1, wherein the cooling element is attached to the side wall.

4. The electronic device according to claim 3, wherein the attachment of the cooling element to the side wall is performed by riveting.

5. The electronic device according to claim 2, wherein the cooling element is attached to the side wall.

6. The electronic device according to claim 1, wherein the cooling element is made of copper, a copper alloy, an aluminum or an aluminum alloy.

7. The electronic device according to claim 2, wherein the cooling element is made of copper, a copper alloy, an aluminum or an aluminum alloy.

8. The electronic device according to claim 3, wherein the cooling element is made of copper, a copper alloy, an aluminum or an aluminum alloy.

9. The electronic device according to claim 4, wherein the cooling element is made of copper, a copper alloy, an aluminum or an aluminum alloy.

10. The electronic device according to claim 5, wherein the cooling element is made of copper, a copper alloy, an aluminum or an aluminum alloy.

* * * * *